United States Patent
Layadi et al.

(10) Patent No.: US 6,436,829 B1
(45) Date of Patent: Aug. 20, 2002

(54) TWO PHASE CHEMICAL/MECHANICAL POLISHING PROCESS FOR TUNGSTEN LAYERS

(75) Inventors: Nace Layadi, Singapore (SG); Arun K. Nanda, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/632,445

(22) Filed: Aug. 4, 2000

(51) Int. Cl.$^7$ ............................................. H01L 21/302

(52) U.S. Cl. ........................ 438/691; 438/692; 438/693

(58) Field of Search ................................ 438/690, 691, 438/692, 693, 625, 626, 627, 637; 451/36, 41

(56) References Cited

U.S. PATENT DOCUMENTS

| | | | |
|---|---|---|---|
| 5,700,383 A | * 12/1997 | Feller et al. | 216/88 |
| 5,954,975 A | * 9/1999 | Cadien et al. | 216/38 |
| 6,217,416 B1 | * 4/2001 | Kaufman et al. | 451/41 |
| 6,258,721 B1 | * 7/2001 | Li et al. | 438/693 |

* cited by examiner

Primary Examiner—Robert Kunemund
Assistant Examiner—Lan Vinh

(57) ABSTRACT

The present invention provides a method for polishing a semiconductor substrate comprising: (a) polishing a metal layer located on a semiconductor wafer with a slurry at a first polishing rate, wherein the slurry has a predetermined concentration of an oxidizing agent therein; (b) forming a diluted slurry by diluting the polishing slurry with a diluent to substantially reduce the predetermined concentration of the oxidizing agent; and (c) polishing the metal layer at a second polishing rate less than the first polishing rate and in the presence of the diluted slurry.

28 Claims, 7 Drawing Sheets

TWO PHASE CHEMICAL/MECHANICAL POLISHING PROCESS FOR TUNGSTEN LAYERS

TECHNICAL FIELD OF THE INVENTION

The present invention is directed, in general, to manufacturing a semiconductor wafer and, more specifically, to a method of chemical/mechanical polishing of tungsten layers comprising two phases for reducing tungsten-seam defects in via plugs of integrated circuits.

BACKGROUND OF THE INVENTION

Referring initially to FIGS. 1A, 1B and 1C, illustrated are sectional views of a contact opening 110, or Via, conventionally formed in a dielectric 101 of semiconductor wafer 100 at progressive stages of tungsten plug 130 formation. FIG. 1A shows a conventional tungsten plug 130 formed in the contact opening 110. The contact opening 110 is typically cylindrical in shape, formed within the dielectric 101, and comprises a bottom 111 and a wall 113. A surface 103 of the dielectric 101 will surround the contact opening or via 110. Underlying the bottom ill of the contact opening 110 is an active component 120 with a contact surface 122. The active component 120 may be the source or drain, or gate region of a conventional semiconductor device, and in the situation where the contact opening 110 is a Via, the active component may be an aluminum trace.

After forming the contact opening 110 in the dielectric 101, titanium (Ti) and titanium nitride (TiN) layers 114, 115, respectively, are deposited on the dielectric surface 103, contact bottom 111 and wall 113. The titanium/titanium nitride layers 114, 115, form adhesion/barrier layers for further deposition. Following the TiN layer, a blanket chemical vapor deposition of tungsten fills the remaining void of the contact opening 110 with tungsten forming a tungsten plug 130. Sufficient tungsten is deposited to "overfill" the contact opening 110, forming the tungsten plug 130 and a tungsten layer 136 over the TiN layer 115. After filling the via 110 with the W plug 130, some voids 133a or "tungsten seams" (W-seams) are usually observed in the surface 134 of the W plug 130, especially when the etched profiles are straight.

Chemical/mechanical polishing (CMP) is commonly used to planarize both dielectric and metal layers. For example, CMP is used to remove part of the tungsten (W), Ti and TiN layers to finish the via plug formation down to the dielectric 101. While planarizing the metal layer, a CMP process must avoid or cause only minimal metal dishing and oxide erosion while avoiding removal of the underlying oxide or other dielectric. The process must also avoid introducing non-uniformity to the dielectric thickness.

In CMP, a semiconductor wafer is rotated face-down against a polishing pad in the presence of an abrasive slurry comprising a suspension of small abrasive particles, usually an inorganic oxide, in a chemically acidic or basic aqueous solution. The acidic or basic solution is chosen based upon the primary material, in this instance a metal (tungsten), that is being planarized so as to induce a chemical reaction with the material. The chemical reaction changes the metal to a chemical compound that may be more readily removed by mechanical abrasion. For example, the surface of the tungsten layer 134 may be oxidized with a slurry comprising hydrogen peroxide ($H_2O_2$). The resulting tungsten oxide is then more readily removed with an abrasive comprising silicon dioxide ($SiO_2$) and/or aluminum oxide ($Al_2O_3$), than metallic tungsten would be.

However, conventional tungsten CMP slurries with an $Al_2O_3$ abrasive tend to cause wafer surface scratching because the primary tungsten removal mechanism is mechanical. In this case, polish (removal) rate is a function of the down-force on the wafer as well as the rotation speeds of the platen and wafer carrier; of course, other factors may also enter into the polish rate. Since a relatively high down-force on the wafer is needed with this slurry, metal dishing is a common undesirable effect. To correct for the dishing effect, an additional step, i.e., an "oxide buff," is required. Tungsten removal rate with these slurries typically range from about 200 nm per minute to about 500 nm per minute. Of course, it should be understood that the slurry type can readily affect both the removal rate and the wafer uniformity. Slurries that contain aggressive chemistries may provide higher removal rates, but they tend to cause more dishing or erosion.

However, a W-polishing slurry using a silicon dioxide ($SiO_2$) abrasive does not exhibit the scratching problem of the $Al_2O_3$ slurry, and therefore does not require the additional oxide buff. The $H_2O_2$ component of the slurry oxidizes the W surface, and the oxide is subsequently removed with the mechanical $SiO_2$ abrasive. Removal rate of the tungsten with this slurry ranges from about 250 nm per minute to about 600 nm per minute depending upon, among other factors, the $H_2O_2$ concentration, apparatus down force and platen rotational speed. Metal (W, Ti, TiN) removal is continued until the Ti barrier layer 115 and the TiN adhesion layer 114 are planarized down to the dielectric 101.

Referring now to FIG. 1B, illustrated is a sectional view of the conventional tungsten plug of FIG. 1A after removal of exposed tungsten by conventional chemical/mechanical planarization. It is known that the $H_2O_2$ will attack W-seams 133a and may even widen them as shown in FIG. 1B.

Referring now to FIG. 1C, illustrated is a sectional view of the conventional tungsten plug of FIG. 1B after removal of the titanium nitride and titanium barrier layers by conventional chemical/mechanical planarization. As can be seen in FIGURE 1C, the W-seam 133a defect may persist even into the finished tungsten plug 130. Such W-seam 133a defects remaining in a finished integrated circuit have proven to cause some electrical device degradation, especially causing leakage current in MOM (metal-oxide-metal) capacitor structures.

Accordingly, what is needed in the art is a method of chemical/mechanical polishing for tungsten layers on semiconductor wafers that reduces the probability of W-seam defects.

SUMMARY OF THE INVENTION

To address the above-discussed deficiencies of the prior art, the present invention provides, in one embodiment, a method for polishing a semiconductor substrate comprising: (a) polishing a metal layer located on a semiconductor wafer with a first slurry at a first polishing rate wherein the first slurry has a predetermined concentration of an oxidizing agent therein; (b) forming a second slurry having less than the predetermined concentration of an oxidizing agent therein; and (c) polishing the metal layer at a second polishing rate less than the first polishing rate and in the presence of the second slurry.

In another embodiment, polishing a metal layer at a first polishing rate includes polishing a metal layer at a first polishing rate wherein the predetermined concentration of the oxidizing agent ranges from about 2 to about 6 weight percent by volume. Polishing a metal layer with a first slurry at a first polishing rate, in an alternative embodiment may include polishing a metal layer wherein the first slurry comprises silicon dioxide. Another embodiment provides a method where the step of polishing a metal layer with a first slurry at a first polishing rate includes polishing a metal layer at a first polishing rate wherein the oxidizing agent comprises hydrogen peroxide.

Forming a second slurry may include forming a second slurry having an oxidizer concentration less than about 2.0 percent by volume. In a particular aspect of this embodiment, forming a second slurry includes forming a second slurry having an oxidizer concentration not greater than about 1.7 weight percent by volume. Forming a second slurry, in a related embodiment, includes forming a second slurry by diluting the first slurry with deionized water. The second slurry may be formed by diluting the first slurry with a diluent-to-slurry ratio ranging from about 3:1 to about 6:1.

In another embodiment, polishing at a first polishing rate includes polishing at a first polishing rate ranging from about 350 nm per minute to about 500 nm per minute. More specifically, the first polishing rate may be about 450 nm per minute. Polishing at a second polishing rate, in another embodiment, includes polishing at a second polishing rate ranging from about 60 nm per minute to about 100 nm per minute.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
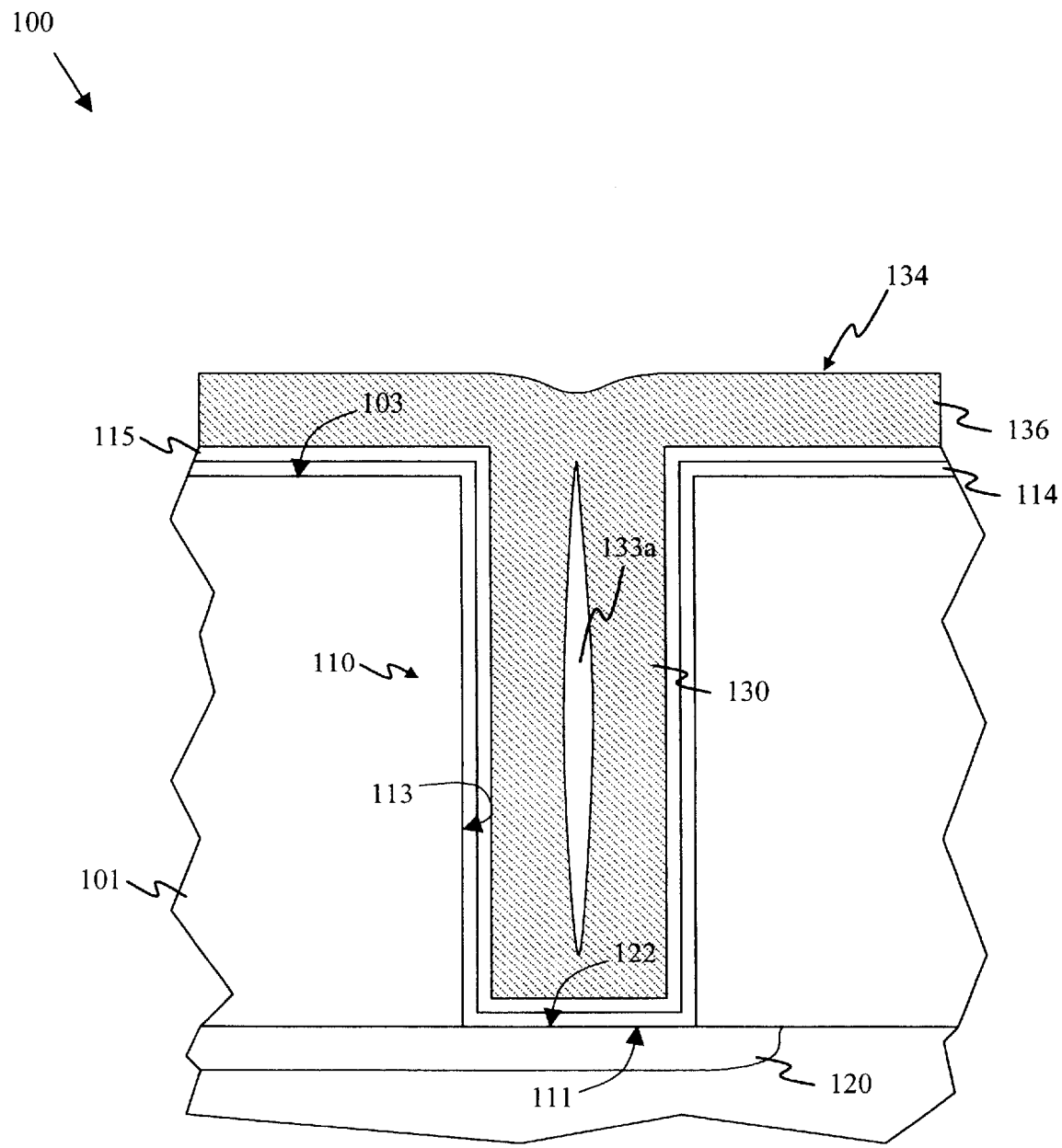
FIG. 1A illustrates a sectional view of a conventional tungsten plug formed in a contact opening in a dielectric of a conventional semiconductor wafer.
Figure 1B:
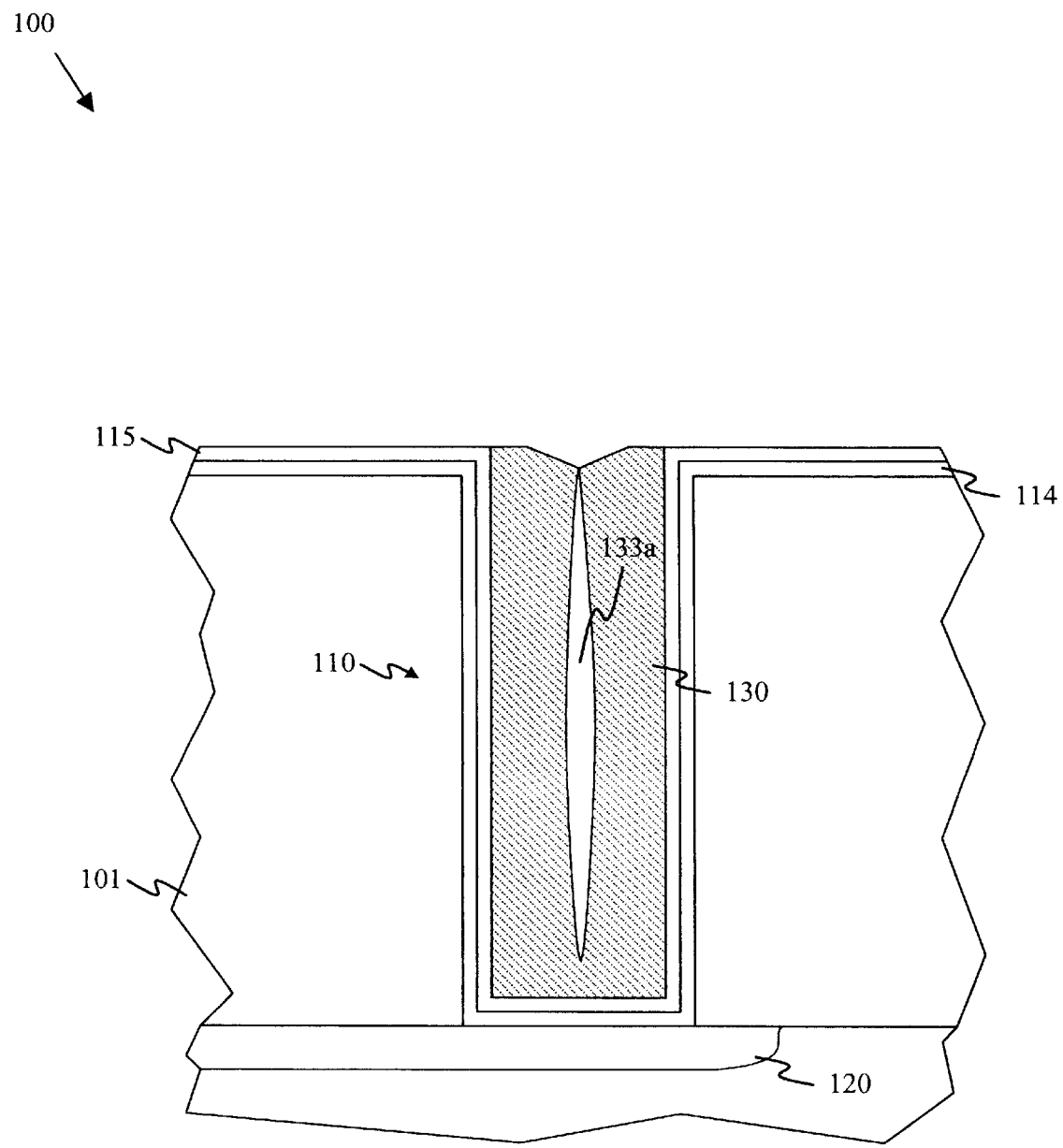
FIG. 1B illustrates a sectional view of the conventional tungsten plug of FIG. 1A after removal of exposed tungsten by conventional chemical/mechanical planarization.
Figure 1C:
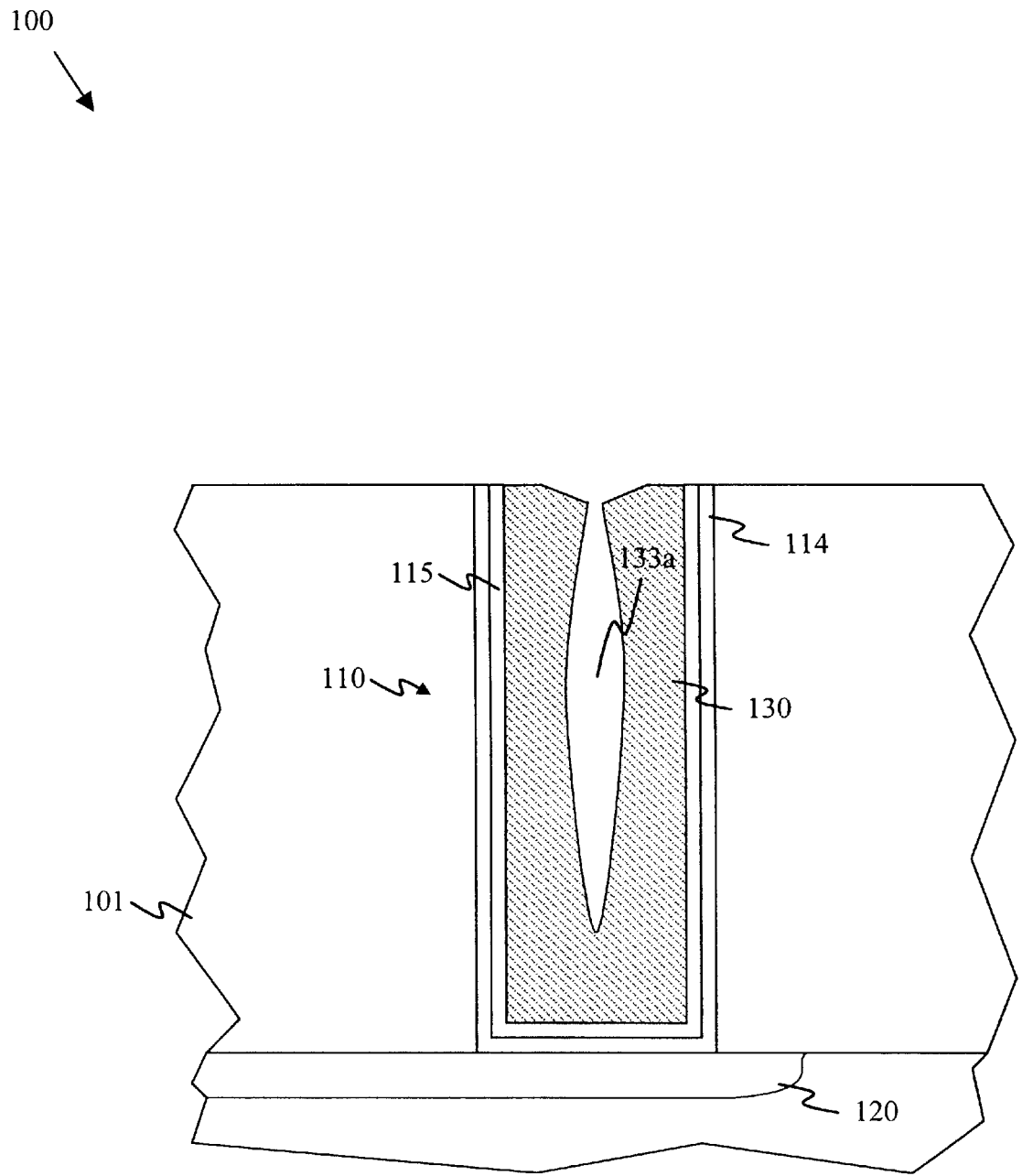
FIG. 1C illustrates a sectional view of the conventional tungsten plug of FIG. 1B after removal of the titanium nitride and titanium barrier layers by conventional chemical/mechanical planarization.
Figure 2:
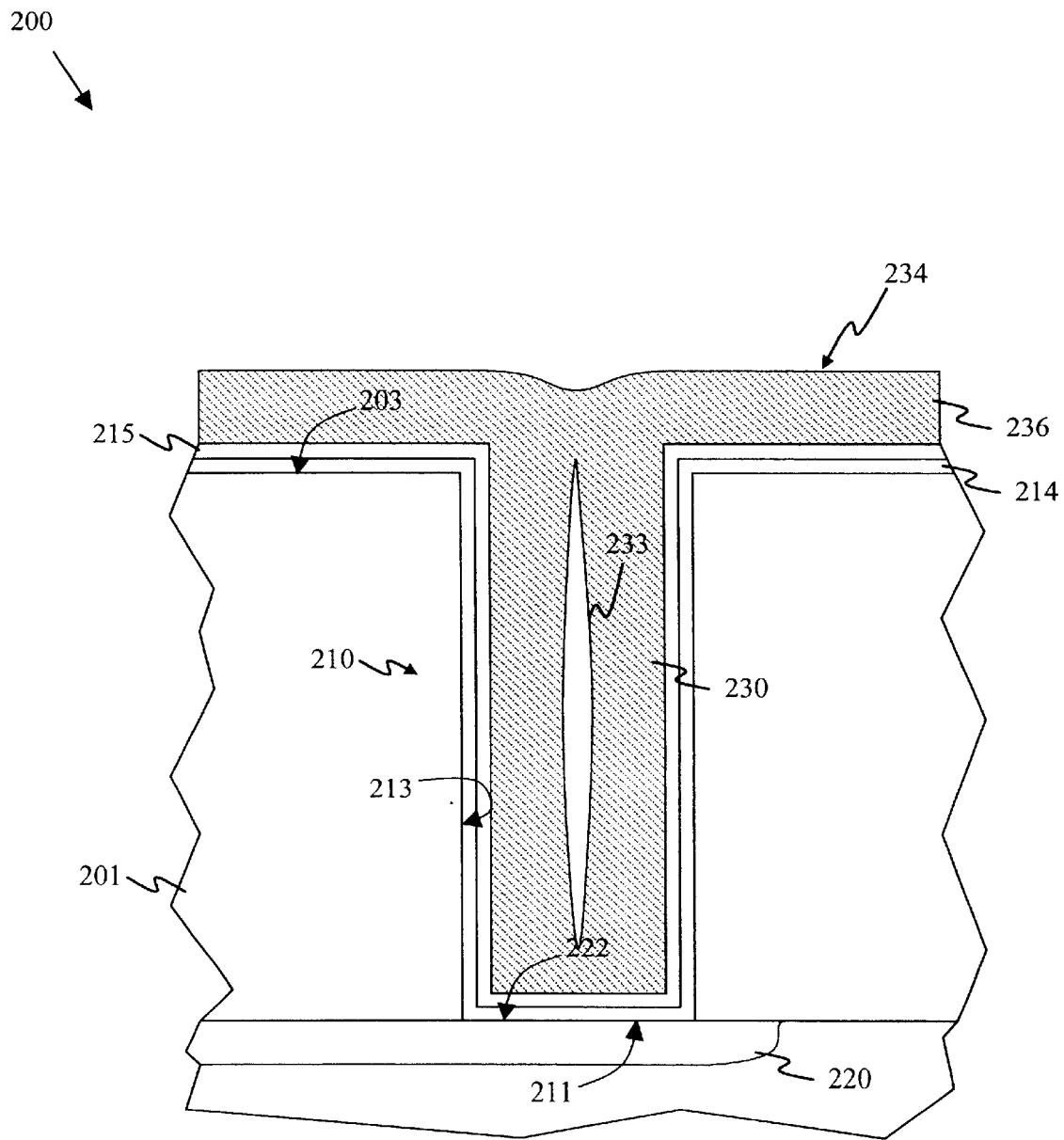
FIG. 2 illustrates a sectional view of one embodiment of a conventional contact opening and conventional tungsten plug formed in a dielectric of a conventional semiconductor wafer.

Referring now to FIG. 2, illustrated is a sectional view of one embodiment of a conventional contact opening 210 and conventional tungsten plug 230 formed in a dielectric 201 of a conventional semiconductor wafer 200. As in FIGUREs 1A–1C, the contact opening 210 comprises a bottom 211 and a wall 213. A surface 203 of the dielectric 201 surrounds the contact opening or via 210. Underlying the bottom 211 of the contact opening 210 is an active component 220, such as a source/drain region or a gate of to a transistor, with a contact surface 222. Titanium (Ti) and titanium nitride (TiN) layers 214, 215, respectively, are deposited on the dielectric surface 203, contact bottom 211 and wall 213. A blanket deposition of tungsten fills the remaining void of the contact opening 210 forming tungsten plug 230 and a tungsten layer 236 atop the tungsten plug 230. In the illustrative embodiment, a W-seam 233 is present in the W plug 230. As one having skill in the art already knows, the W-seam 233 may result from a tungsten chemical vapor deposition (CVD) or other similar process.

Figure 3:
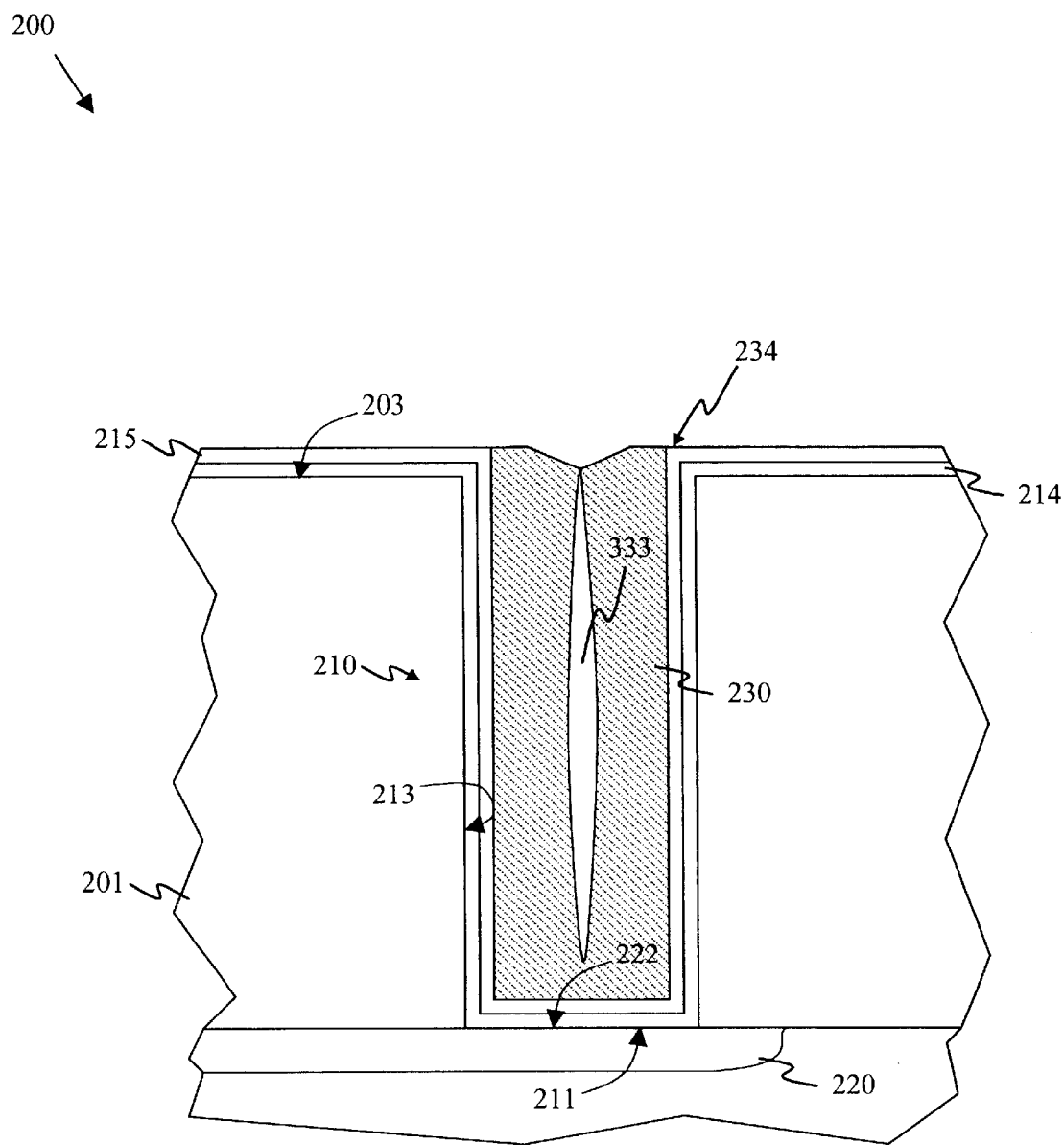
FIG. 3 illustrates a sectional view of the contact opening and tungsten plug of FIG. 2 after polishing at a first polish rate in accordance with the principles of the present invention.

Referring now to FIG. 3, illustrated is a sectional view of the contact opening 210 and tungsten plug 230 of FIG. 2 after polishing at a first polish rate in accordance with the principles of the present invention. The semiconductor wafer 200 has been subjected to a first chemical/mechanical polishing with a slurry having a predetermined concentration of an oxidizing agent therein. For the purposes of this discussion, the oxidizing agent for this planarization may be hydrogen peroxide ($H_2O_2$) at a predetermined concentration ranging from about 2 to about 6 weight percent by volume of the hydrogen peroxide. Of course, one who is skilled in the art will recognize that other oxidizers may also be used. This concentration of oxidizer causes a significant chemical reaction with the surface 234 of the tungsten layer 236, forming tungsten oxide. The abrasive portion of the slurry, i.e., silicon dioxide, may then mechanically remove the tungsten oxide. This first chemical/mechanical polishing may involve polishing at a tungsten removal (polishing) rate ranging from about 350 nm per minute to about 500 nm per minute. In a particularly advantageous aspect of this embodiment, the first removal rate is about 450 nm per minute. Because of the concentration of oxidizer in the first slurry, the W-seam 233 of FIG. 2 has progressed to a W-seam 333 as shown. Note however, that the W-seam 333 is not exposed to the oxidizer and will remain intact. Polishing with the first slurry may be terminated when the tungsten layer 236 has been removed, and the TiN layer is reached. The determination of having reached the TiN layer is by conventional methods known to those who are skilled in the art.

Figure 4:
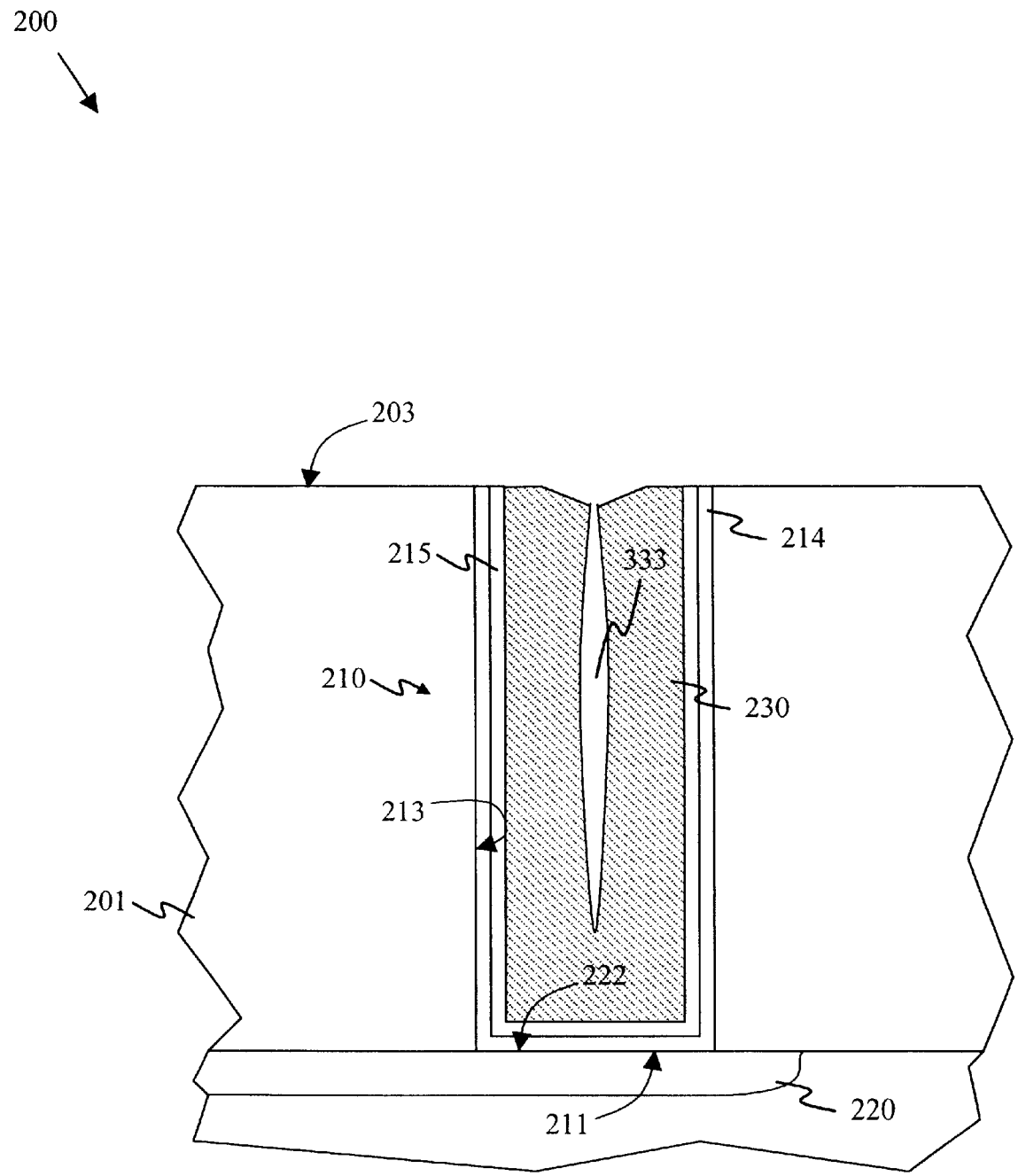
FIG. 4 illustrates a sectional view of the contact opening and tungsten plug of FIG. 3 after polishing at a second polish rate.

Referring now to FIG. 4, illustrated is a sectional view of the contact opening 210 and tungsten plug 230 of FIG. 3 after polishing at a second polish rate. The semiconductor wafer 200 has been subjected to a second chemical/mechanical polishing in the presence of a second slurry. The second slurry should have less than the predetermined concentration of the oxidizing agent included in the first slurry. In one particular advantageous embodiment the second slurry is a diluted slurry formed from the original slurry of FIG. 3. The original slurry, comprising silicon dioxide and hydrogen peroxide having a predetermined concentration of an hydrogen peroxide ranging from about 2 to about 6 weight percent by volume therein, may be diluted with a diluent, such as deionized water, to form the diluted slurry. Thus, the $H_2O_2$ of the slurry used at the first polishing rate may be diluted with deionized water to substantially reduce the predetermined concentration of oxidizer, thereby limiting its chemical action on the tungsten plug 230.

In one embodiment, the diluted slurry has an oxidizer concentration less than about 2.0 percent by volume. In a particularly advantageous embodiment, the oxidizer concentration is diluted to a concentration of not greater than about 1.7 weight percent by volume. This may require diluting the polishing slurry so as to create a diluent-to-slurry ratio ranging from about 3:1 to about 6:1. This concentration of $H_2O_2$ changes the slurry action from a primarily-chemical to a primarily-mechanical action for removal of the metal layers. Accordingly, with a primarily-mechanical removal action, the second removal rate ranges from about 60 nm per minute to about 100 nm per minute. Also, it should be noted that with a primarily-mechanical action, chemical action that would cause the W-seam 233 of FIG. 2 to continue to progress has been minimized, thereby essentially preventing a W-seam defect from appearing in the final tungsten plug 230.

In another advantageous embodiment of the invention, the second slurry is a slurry similar to the original slurry, however, having substantially no oxidant located therein. In such an embodiment, the second chemical/mechanical polishing would predominately comprise a mechanical polishing component. If this particular advantageous embodiment were chosen, there could be two slurry distribution systems, wherein one includes an oxidant for a bulk chemical/mechanical tungsten polishing, and the other does not include the oxidant for mechanical tungsten polishing. Polishing with the diluted slurry, whether oxidant is present or not, may be terminated when the titanium layer 214 has been removed, and the dielectric is reached. The determination of having reached the dielectric may be accomplished by conventional methods known to those who are skilled in the art.

Figure 5:
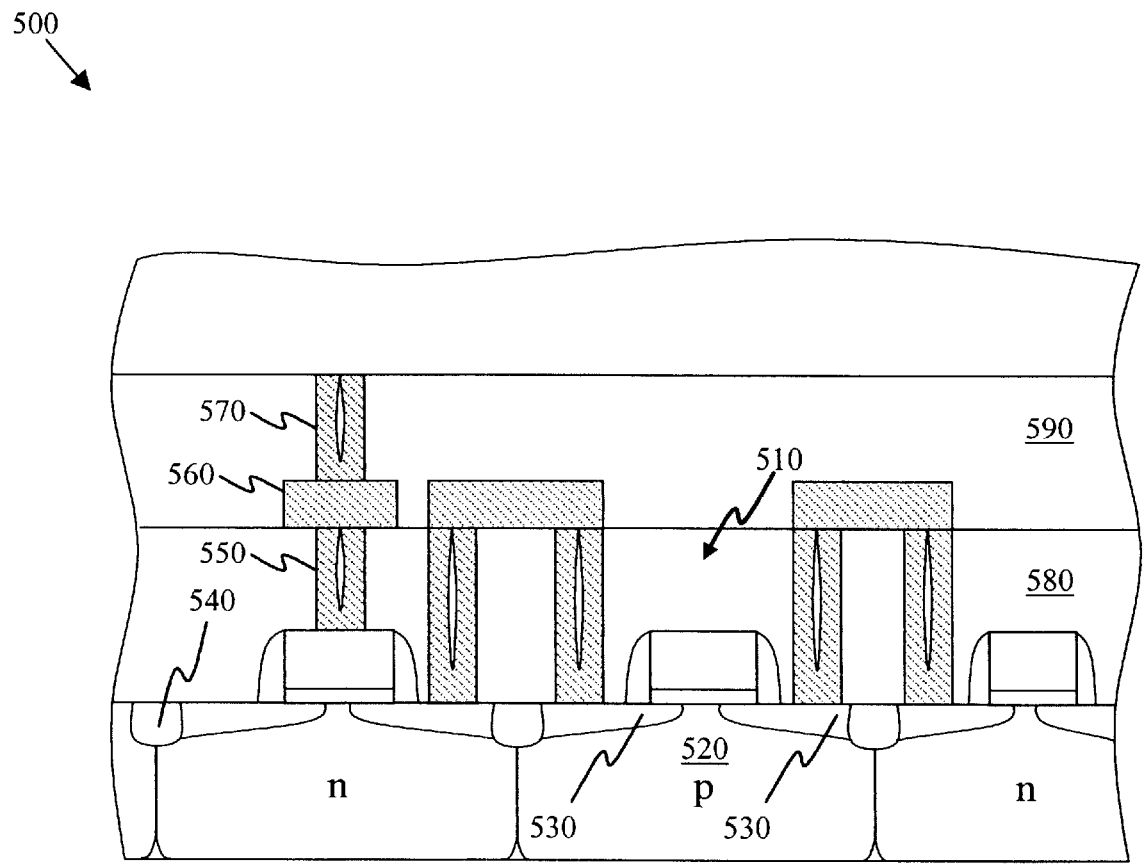
FIG. 5 illustrates a partial sectional view of a conventional integrated circuit that can be manufactured using the method in accordance with the principles of the present invention.

Referring now to FIG. 5, illustrated is a partial sectional view of a conventional integrated circuit 500 that can be manufactured using the method in accordance with the principles of the present invention. In this particular sectional view, there is illustrated an active device 510 that comprises a tub region 520, source/drain regions 530 and field oxides 540, which together may form a conventional transistor that may include devices, such as a CMOS, PMOS, NMOS or bi-polar transistor devices. A contact plug 550 contacts the active device 510. The contact plug 550 is, in turn, contacted by a trace 560 that connects to other regions of the integrated circuit, which are not shown. A VIA 570 contacts the trace 560, which provides electrical connection to subsequent levels of the integrated circuit 500. Interlevel dielectric layers 580, 590 may also be present.

Therefore, a method of polishing metal layers with a two-stage chemical/mechanical polishing process has been described that uses a first slurry with a first metal removal rate and a second diluted slurry with a second metal removal rate. Using a two stage chemical/mechanical polishing process changes the slurry action of the second stage from primarily chemical to primarily mechanical and minimizes the possibility of propagating tungsten seam defects into the finished tungsten plugs.

Although the present invention has been described in detail, those skilled in the art should understand that they can make various changes, substitutions and alterations herein without departing from the spirit and scope of the invention in its broadest form.

What is claimed is:

1. A method for polishing a semiconductor substrate, comprising:
   polishing a metal layer located on a semiconductor wafer with a first slurry at a first polishing rate, the first slurry having a concentration of an oxidizing agent therein; then
   forming a second slurry having less than the concentration of the oxidizing agent; and
   polishing the metal layer at a second polishing rate less than the first polishing rate and in the presence of the second slurry.

2. The method as recited in claim 1 wherein polishing a metal layer at a first polishing rate includes polishing a metal layer at a first polishing rate wherein the concentration of the oxidizing agent ranges from about 2 to about 6 weight percent by volume.

3. The method as recited in claim 1 wherein polishing a metal layer with a first slurry at a first polishing rate includes polishing a metal layer wherein the first slurry comprises silicon dioxide.

4. The method as recited in claim 1 wherein polishing a metal layer with a first slurry at a first polishing rate includes polishing a metal layer at a first polishing rate wherein the oxidizing agent comprises hydrogen peroxide.

5. The method as recited in claim 1 wherein polishing at a second polishing rate includes polishing at a second polishing rate ranging from about 60 nm per minute to about 100 nm per minute.

6. The method as recited in claim 1 wherein forming a second slurry includes forming a second slurry by diluting the first slurry with a diluent-to-first slurry ratio ranging from about 3:1 to about 6:1.

7. The method as recited in claim 1 wherein polishing a metal layer includes polishing a metal layer comprising tungsten.

8. The method as recited in claim 1 wherein forming a second slurry having less than the concentration of the oxidizing agent includes forming a second slurry having substantially no oxidizing agent.

9. The method as recited in claim 1 wherein forming a second slurry having less than the concentration of the oxidizing agent includes forming a second slurry having an oxidizer concentration less than about 2.0 weight percent by volume.

10. The method as recited in claim 9 wherein forming a second slurry having an oxidizer concentration less than about 2.0 weight percent by volume includes forming a second slurry having an oxidizer concentration not greater than about 1.7 weight percent by volume.

11. The method as recited in claim 1 wherein forming a second slurry includes forming a second slurry by diluting the first slurry with a diluent.

12. The method as recited in claim 11 wherein forming a second slurry by diluting the first slurry with a diluent includes forming a second slurry by diluting the first slurry with de-ionized water.

13. The method as recited in claim 1 wherein polishing at a first polishing rate includes polishing at a first polishing rate ranging from about 350 nm per minute to about 500 nm per minute.

14. The method as recited in claim 13 wherein polishing at a first polishing rate includes polishing at a first polishing rate of about 450 nm per minute.

15. A method of fabricating an integrated circuit, comprising:

forming transistors on a semiconductor wafer;

forming interlevel dielectric layers over the transistors; and forming interconnects in the dielectric layers including:

polishing a metal layer located on a semiconductor wafer with a first slurry at a first polishing rate, the first slurry having a concentration of an oxidizing agent therein; then forming a second slurry having less than the concentration of the oxidizing agent; and polishing the metal layer at a second polishing rate less than the first polishing rate and in the presence of the second slurry.

16. The method as recited in claim 15 wherein polishing a metal layer at a first polishing rate includes polishing a metal layer at a first polishing rate wherein the concentration of the oxidizing agent ranges from about 2 to about 6 weight percent by volume.

17. The method as recited in claim 15 wherein polishing a metal layer with a first slurry at a first polishing rate includes polishing a metal layer wherein the first slurry comprises silicon dioxide.

18. The method as recited in claim 15 wherein polishing a metal layer with a first slurry at a first polishing rate includes polishing a metal layer at a first polishing rate wherein the oxidizing agent comprises hydrogen peroxide.

19. The method as recited in claim 15 wherein polishing at a second polishing rate includes polishing at a second polishing rate ranging from about 60 nm per minute to about 100 nm per minute.

20. The method as recited in claim 15 wherein forming a second slurry includes forming a second slurry by diluting the first slurry with a diluent-to-first slurry ratio ranging from about 3:1 to about 6:1.

21. The method as recited in claim 15 wherein polishing a metal layer includes polishing a metal layer comprising tungsten.

22. The method as recited in claim 15 wherein forming a second slurry having less than the concentration of the oxidizing agent includes forming a second slurry having substantially no oxidizing agent.

23. The method as recited in claim 15 wherein forming a second slurry having less than the concentration of the oxidizing agent includes forming a second slurry having an oxidizer concentration less than about 2.0 weight percent by volume.

24. The method as recited in claim 23 wherein forming a second slurry having an oxidizer concentration less than about 2.0 weight percent by volume includes forming a second slurry having an oxidizer concentration not greater than about 1.7 weight percent by volume.

25. The method as recited in claim 15 wherein forming a second slurry includes forming a second slurry by diluting the first slurry with a diluent.

26. The method as recited in claim 25 wherein forming a second slurry by diluting the first slurry with a diluent includes forming a second slurry by diluting the first slurry with de-ionized water.

27. The method as recited in claim 15 wherein polishing at a first polishing rate includes polishing at a first polishing rate ranging from about 350 nm per minute to about 500 nm per minute.

28. The method as recited in claim 27 wherein polishing at a first polishing rate includes polishing at a first polishing rate of about 450 nm per minute.

* * * * *